(12) United States Patent
Utsumi

(10) Patent No.: US 6,574,722 B2
(45) Date of Patent: Jun. 3, 2003

(54) SEMICONDUCTOR STORAGE DEVICE

(75) Inventor: Toru Utsumi, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 247 days.

(21) Appl. No.: 09/732,053

(22) Filed: Dec. 6, 2000

(65) Prior Publication Data

US 2001/0003200 A1 Jun. 7, 2001

(30) Foreign Application Priority Data

Dec. 7, 1999 (JP) ............................................. 11-347645
Nov. 21, 2000 (JP) ........................................ 2000-354677

(51) Int. Cl.⁷ ............................................... G06F 12/10

(52) U.S. Cl. ........................ 711/211; 711/219; 711/220

(58) Field of Search ................................ 711/211, 219, 711/220

(56) References Cited

U.S. PATENT DOCUMENTS

| | | | |
|---|---|---|---|
| 4,901,236 A | | 2/1990 | Utsumi ........................ 711/200 |
| 5,778,439 A | * | 7/1998 | Trimberger et al. ......... 711/153 |
| 5,784,710 A | * | 7/1998 | Kaiser et al. ................ 711/212 |

* cited by examiner

Primary Examiner—David L. Robertson
(74) Attorney, Agent, or Firm—Gray Cary Ware & Freidenrich LLP

(57) ABSTRACT

If a word line is selected by inputting an immediate value and base address, whose values are determined at different timings, to an adder, the access speed decreases due to the constraint of the base address whose value is determined at a later timing. According to this invention, decoding is performed by inputting only the immediate value whose value is determined earlier to an address decoder AD. Thereafter, a word line WL is selected by performing rotation using the base address whose value is determined at a later timing. This makes it possible to start decoding processing without waiting for the determination of the value of the base address and increase the overall access speed.

12 Claims, 7 Drawing Sheets

SEMICONDUCTOR STORAGE DEVICE

CROSS REFERENCE TO RELATED APPLICATION

This application claims benefit of priority under 35USC §119 to Japanese Patent Application No. 1999-347645, filed on Jan. 7, 1999, and No. 2000-354677, filed on Nov. 21, 2000, the entire contents of which are incorporated by reference herein.

BACKGROUND OF THE INVENTION

The present invention relates to a semiconductor storage device and, more particularly, to a semiconductor storage device including a circuit for calculating addresses.

FIG. 10 shows the arrangement of an address calculation circuit and cache cell array included in a cache memory mounted in a microprocessor or the like as a semiconductor storage device related to the present invention.

An instruction code executed by a microprocessor (not shown) contains an immediate value and register file value, i.e., a register number for designating a base address. This immediate value and base address are added by an adder ADD to generate an index address.

The index address is supplied to an address decoder AD to be decoded. One of a plurality of word lines WL is selected on the basis of the decoding result. The word lines WL run in the row direction of a cache cell array CCA having an array of memory cells to commonly connect the memory cells arranged in the row direction. One of the word lines is selected on the basis of an immediate value and base address.

Consider a case wherein 16 word lines WL0 to WL15 are accessed by a 4-bit address. If an immediate value is "0000" and a base address is "0001", the output from the adder ADD becomes "0001". This output is supplied to the address decoder AD, and "0000000000000010" is output to the 16 word lines WL. Of bits 0 to 15, "1" is assigned to only the first bit, and "0"s are assigned to the remaining bits, thereby selecting the word line WL1 corresponding to the first bit.

The following problem arises in an address calculation circuit included in this semiconductor storage device. An immediate value and base address are not input to the adder ADD at the same timing, but the base address is input at a later thing for the following reason. The immediate value is directly contained in the instruction code, whereas only the register number of the base address is contained in the instruction code itself, and it takes time to determine the value of the base address and output it after the register number is input to the register file. For this reason, no output can be obtained from the adder ADD until the value of the base address is determined, and it takes time to select a word line WL, resulting in a decrease in overall access speed.

SUMMARY OF THE INVENTION

The present invention has been made in consideration of the above situation, and has as its object to provide a semiconductor storage device which can increase the access speed.

A semiconductor storage device according to the present invention is a device in which access is made by generating an address by using first and second signals and characterized by comprising an address decoder for generating a decode signal by performing decoding using the first signal whose value is determined at a timing equal to or earlier than a timing at which a value of the second signal is determined, a word line rotator for rotating the decode signal generated by the address decoder by using the second signal to generate a word line selection signal, and a cell array to which the word line selection signal generated by the word line rotator is supplied to select a word line.

In addition, according to the present invention, there is provided a semiconductor storage device in which access is made by generating an address by using first and second signals, characterized by comprising an address decoder for generating a decode signal by performing decoding using a predetermined pit of the first signal whose value is determined at a timing equal to or earlier than a timing at which a value of the second signal is determined, a word line rotator for rotating the decode signal generated by the address decoder by using a predetermined bit of the second signal to generate a word line selection signal, an adder for generating a carry signal representing the presence/absence of a carry by performing addition processing using bits of the first signal excluding the predetermined bit and bits of the second signal excluding the predetermined bit, a carry rotator for generating a second word line selection signal by rotating the first word line selection signal, generated by the word line rotator, in accordance with the carry signal generated by the adder, as needed, and a cell array to which the second word line selection signal generated by the carry rotator is supplied to select a word line.

Furthermore, according to the present invention, there is provided a semiconductor storage device in which access is made by generating an address by using first and second signals, characterized by comprising an address decoder for generating a decode signal by performing decoding using data of Q bits of data of N bits of the first signal whose value is determined at a timing equal to or earlier than a timing at which a value of the second signal is determined, excluding data of upper M bits, and data of lower P bits contained in the data of the N bits, a word line rotator for rotating the decode signal generated by the address decoder by using data of Q bits contained in data of N bits of the second signal to generate a first word line selection signal, an adder for generating a carry signal representing the presence/absence of a carry at a position of the Pth bit by performing addition processing using the data of the N bits of the first signal and the data of the N bits of the second signal, and also outputting an addition result at a position of the Nth bit, a carry rotator for generating a second word line selection signal by rotating the first word line selection signal, generated by the word line rotator, in accordance with the carry signal generated by the adder, as needed, and a cell array to which the second word line selection signal generated by the carry rotator is supplied to select a word line and output R data, and a multiplexer to which the addition result at the position of the Mth bit is supplied to select and output one of the R data.

In this case, the word line rotator may include a multiplexer group having series-connected multiplexers equal in number of bit signals for the second signal.

In addition, a signal, of the second signals supplied to the word line rotator, whose value is determined at a latest timing may be supplied to the last multiplexer of the multiplexer group.

The carry rotator can be placed between the word line rotator and the memory cell array.

As described above, according to the semiconductor storage device of the present invention, decoding processing is performed by using first the first signal whose value is determined at an earlier timing, and then rotation is performed by using the second signal whose vale is determined at a later timing. This makes it possible to shorten a path through which the second signal whose value is determined at a later timing passes through, i.e., a critical path, and increase the overall access speed.

DESCRIPTION OF THE PREFERRED EMBODIMENTS

An embodiment of the present invention will be described below.

Figure 1:
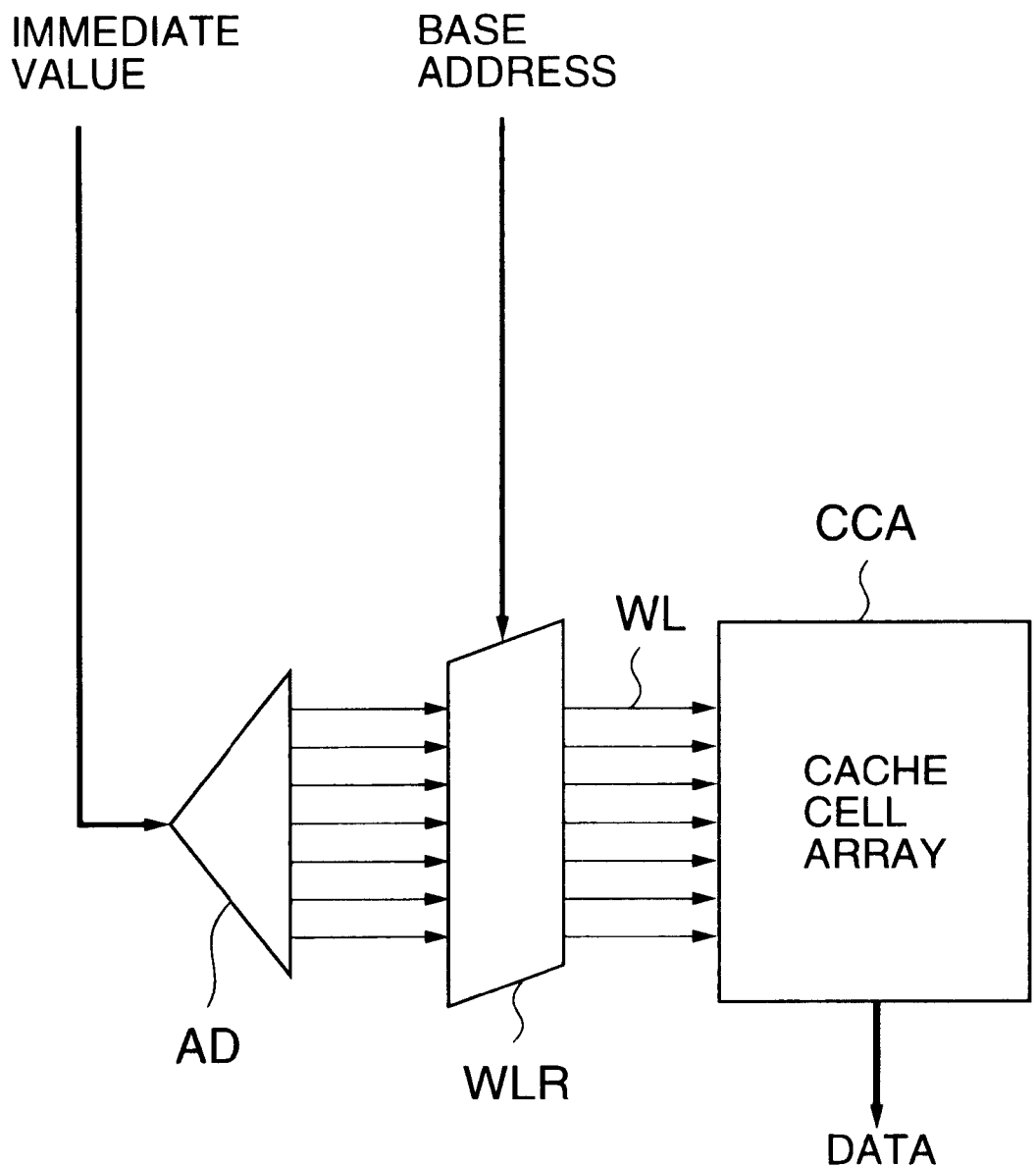
FIG. 1 is a circuit diagram showing the arrangement of a semiconductor storage device according to the first embodiment of the present invention.

FIG. 1 shows the arrangement of a semiconductor storage device according to the first embodiment of the present invention. This device includes an address decoder AD, word line rotator WLR, and cache cell array CCA.

The address decoder AD receives only an immediate value contained in an instruction code and outputs the decoding result to the word line rotator WLR. The word lie rotator WLR receives this decoding result and a base address value and selects one of a plurality of word lines connected to the cache cell array CCA.

Word line selecting operation in this device having such an arrangement will be described below. When an immediate value is input to the address decoder AD, the value is decoded. Logic "1" data is then output to one of the word lines WL, whereas logic "0" data are output to the remaining word lines WL.

The word lines WL are connected to the input and output sides of the word line rotator WLR. When a base address is input to the word line rotator WLR, the rotate amount is controlled. The word line WL selected on the input side of the word line rotator WLR is rotated in accordance with this rotate amount, and the rotated word line WL on the output side is connected to the cache cell array CCA.

As described above, in the device shown in FIG. 10, an immediate value and base address, whose values are determined at different timings, are input to the adder ADD to be added to select the word line WL. For this reason, the timing at which the addition result can be obtained is constrained by the base address whose value is determined at a later timing, resulting in a decrease in overall access time.

In contrast to this, in this embodiment, decoding is performed by the address decoder AD using only the immediate value whose value is determined at an earlier timing without a wait for the inputting of a base address whose value is determined at the later timing. Thereafter, rotation is performed by using the base address whose value is determined at the later timing than the immediate value, thereby finally selecting the necessary word line WL. This makes it possible to increase the overall access speed.

Assume that the cache memory uses a 4-bit address. In this case, if the immediate value is logic "0000", a signal output from the address decoder AD to 16 word lines WL0 to WL15 is logic "0000000000000001". That is, only the word line WL corresponding to the 0th bit is set at logic "1", and all the remaining word lines WL1 to WL15 corresponding to the 1st to 15th bits are set at logic "0".

If the base address is "0001", the word line WL0 corresponding to the 0th bit is rotated by a "1" bit. That is, this bit is shifted in the upper bit direction by one bit, and the logic of the signal is set to "0000000000000010". As a consequence, the word line WL1 corresponding to the 1st bit is selected.

The following is the operation to be performed when the result obtained by adding the immediate value and base address cannot be expressed by 4 or less bits.

Assume that the immediate value has logic "1111", and the base address has logic "0001". If the immediate value is decoded by the address decoder AD, the output becomes logic "1000000000000000". That is, only the 15th bit is set at logic "1", and all the remaining bits are set at logic "0".

If the word line rotator WLR rotates this output by "1" bit, a signal with logic "0000000000000001" is output, thereby selecting the word line WL0 corresponding to the 0th bit. That is, "1" at the most significant bit is shifted in the upper bit direction by one bit, and the overflow value returns to the least significant bit.

Figure 10:
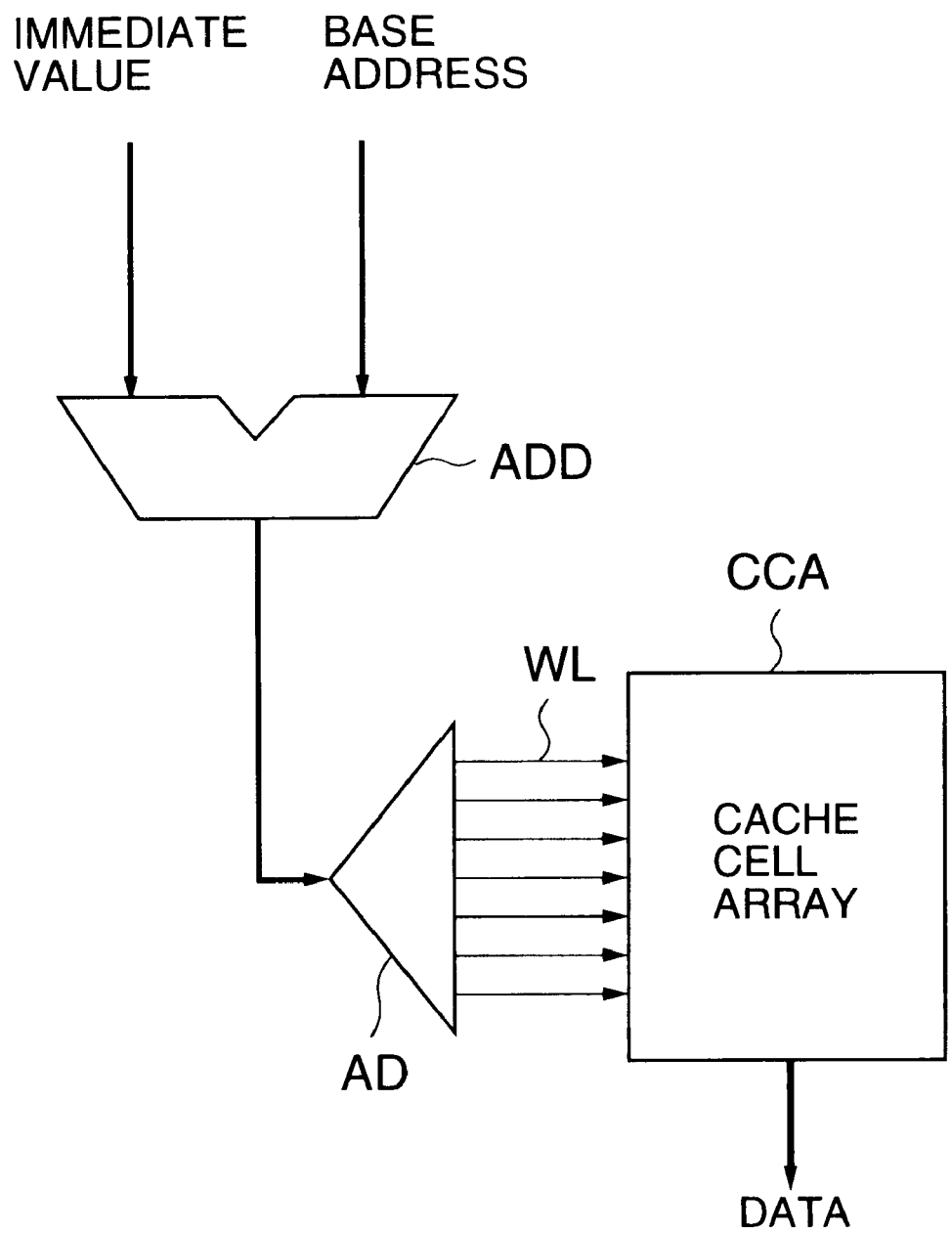
FIG. 10 is a circuit diagram showing the arrangement of a semiconductor storage device related to the present invention.

In the device shown in FIG. 10, the adder ADD is used to add the immediate value "1111" and the base address "0001" to obtain the addition result "0000". In this embodiment, with the above arrangement, the computation result "0000" can be obtained as well.

Figure 2:
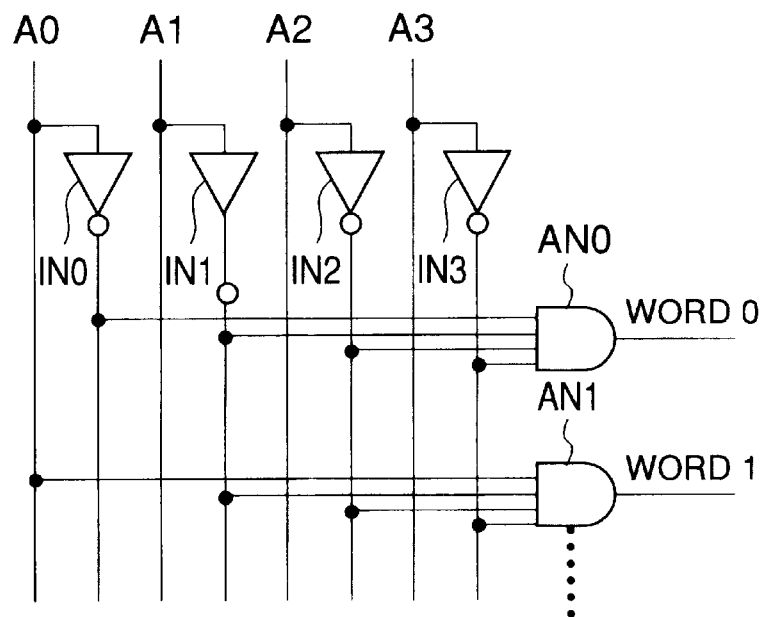
FIG. 2 is a circuit diagram showing the arrangement of an address decoder in the semiconductor storage device of the first embodiment.

FIG. 2 shows an example of the detailed circuit arrangement of the address decoder AD. Assume that the number of word lines WL is expressed by the nth power of 2, and n=4. The address decoder AD has AND circuits AN0, AN1, ..., AN2n−1 (=AN15) equal in number to the word lines WL0, WL1, ..., WL2n−1 (=WL15) and n inverters IN0, IN1, ..., INn−1 (=IN3).

The inverters IN0 to IN3 respectively receive immediate values A0 to A3 and generate and output inverted immediate values /A0 to /A3. A combination of four Immediate values A0 or /A0, A1 or /A1, A2 or /A2, and A3 or /A3 is input to each of the AND circuits AN0 to AN15. The output terminals of the AND circuits AN0 to AN15 are respectively connected to the word lines WL0 to WL15, and logic "1" is output to only one of the word lines WL.

Assume that the immediate value consists of four bits and has logic "0000". In this case, logic "1" is output to only the word line WL0, and logic "0" is output to the remaining word lines WL1 to WL15. If the immediate value has logic "0001", only the word line WL1 is set at logic "1", and the remaining word lines WL0 and WL2 to WL15 are set at logic "0". In this manner, the immediate value is decoded such that only one of the word lines WL is set at logic "1".

Figure 3:
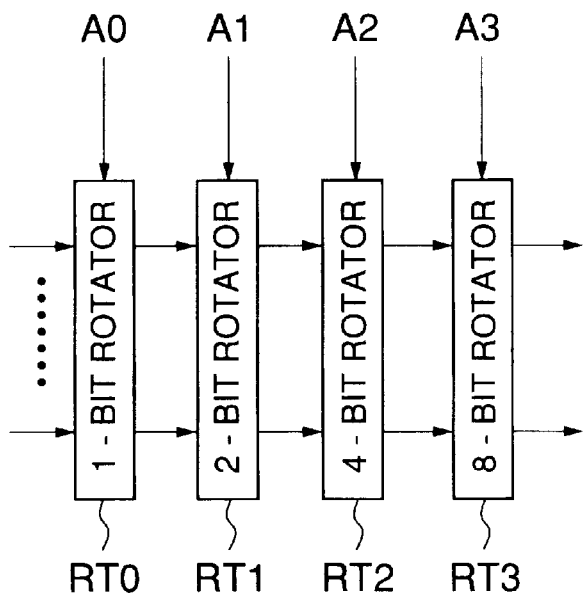
FIG. 3 is a circuit diagram showing the arrangement of a word line rotator in the semiconductor storage device of the first embodiment.

FIG. 3 shows an example of a specific circuit for implementing the word line rotator WLR, which is constituted by a multiplexer group having multiplexers, equal in number to the bits of the base address, connected in series. This word line rotator WLR includes a 1-bit rotator RT0, 2-bit rotator RT1, 4-bit rotator RT2, and 8-bit rotator RT1. Each of the 1-bit rotator RT0, 2-bit rotator RT1, 4-bit rotator RT2, and 8-bit rotator RT3 is formed by a 2-1 multiplexer. The word lines WL0 to WL15 connected to the output terminals of the address decoder AD are connected to the input terminals of the respective multiplexers. The base addresses A0, A1, . . . , A3 are input to the control terminals of the respective multiplexers.

The rotate amount is controlled by these base addresses A0 to A3. For example, the base address A0 input to the 1-bit rotator RT0 decides whether to perform 1-bit rotation. If the base address A0 is at logic "0", the rotate amount is "0". If this bit is at logic "1", the rotate amount is "1".

Likewise, the base address A1 decides whether to perform 2-bit rotation. If the base address A1 is at logic "0", the rotate amount is "0". If this bit is at logic "1", the rotate amount is "2". The base address A2 decides whether to perform 4-bit rotation. If the base address A2 is at logic "0", the rotate amount is "0". If this bit is at logic "1", the rotate amount is "4". The base address A3 decides whether to perform 8-bit rotation. If the base address A3 is at logic "0", the rotate amount is "0". If this bit is at logic "1", the rotate amount is "8".

By using these four base addresses A0 to A3, the rotate amount can be controlled in the range of 0 bit to 15 bits. If, for example, (A3, A2, A1, A0)=(1001), rotation corresponding to 8+0+0+1=9 bits is performed.

Assume that the values of the base addresses A0 to A3 are determined at different timings. In this case, the access speed can be effectively increased by designing the multiplexer group such that base addresses whose values are determined at earlier timings are input to the preceding multiplexers, and base addresses whose values are determined at later timings are input to the succeeding multiplexers. The base address whose value is determined at the latest timing, in particular, is preferably input to the last multiplexer. This prevents the path through which a signal whose value is determined at the latest timing passes from limiting the access speed. Therefore, the access speed can be increased.

In addition, the element area can be reduced by forming the word line rotator WLR using a multiplexer group including a plurality of multiplexers as compared with a case wherein the word line rotator WLR is formed by using a single multiplexer.

In the circuit arrangement shown in FIG. 3, the operation of the rotator formed by one multiplexer is controlled by one base address. Therefore, the arrangement of the rotator can be simplified as compared with a case wherein one rotator is controlled by using a plurality of base addresses.

Figure 4:
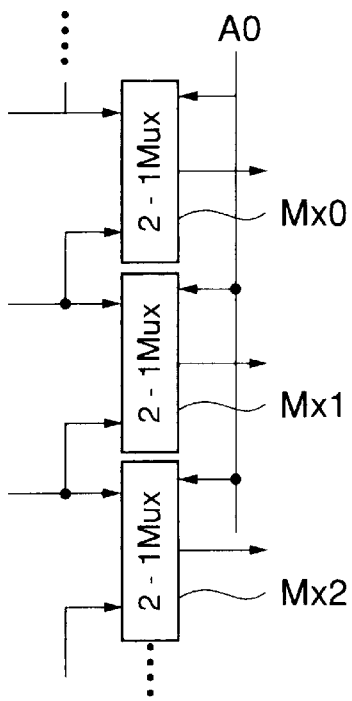
FIG. 4 is a circuit diagram showing the arrangement of a 1-bit rotator in the word line rotator according to the first embodiment.

FIG. 4 shows an example of the circuit arrangement of the 1-bit rotator RT0. This rotator RT0 has 2-1 multiplexers M×0 to M×n equal in number to the word lines WL0 to WLn. Pairs of word lines WL0 and WL1, WL1 and WL2, . . . , WLn and WL0, shifted from each other by one bit, are respectively connected to the multiplexers M×0, M×1, . . . , M×n. The base address A0 is input to each multiplexer to select one of the word lines WL in accordance with the rotate amount.

Figure 5:
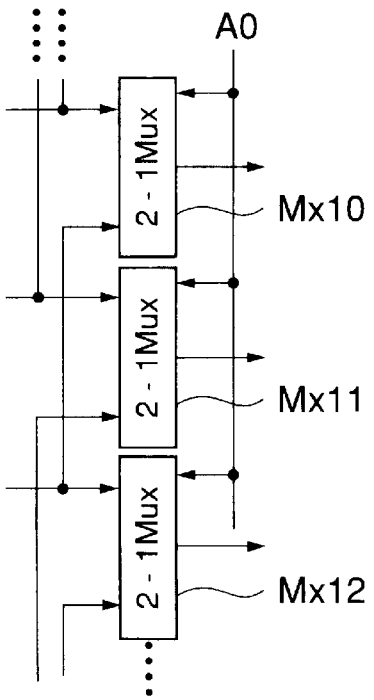
FIG. 5 is a circuit diagram showing the arrangement of a 2-bit rotator in the word line rotator according to the first embodiment.

FIG. 5 shows an example of the circuit arrangement of the 2-bit rotator RT1. This rotator RT1 has 2-1 multiplexers M×10 to M×1n equal in number to the word lines WL0 to WLn. Pairs of word lines WL0 and WL2, WL1 and WL3, . . . , WLn and WL1, shifted from each other by two bits, are respectively connected to the multiplexers M×10, M×11, . . . , M×1n. The base address A1 is input to each multiplexer to select one of the word lines WL in accordance with the rotate amount controlled by the base address A1.

The remaining 4-bit rotator RT2 and 8-bit rotator RT3 can be implemented by similar arrangements. More specifically, in the 4-bit rotator RT2, pairs of word lines WL0 and WL4, WL1 and WL5, . . . , WLn and WL3, shifted from each other by four bits, are respectively connected to n 2-1 multiplexers. The base address A2 is used to decide whether to perform 4-bit rotation, and one of the word line WL is selected.

In the 8-bit rotator RT3, pairs of word lines WL0 and WL8, WL1 and WL9, . . . , WLn and WL7, shifted from each other by eight bits, are respectively connected to n 2-1 multiplexers. The base address A3 is used to decide whether to perform 8-bit rotation, and one of the word line WL is selected.

Figure 6:
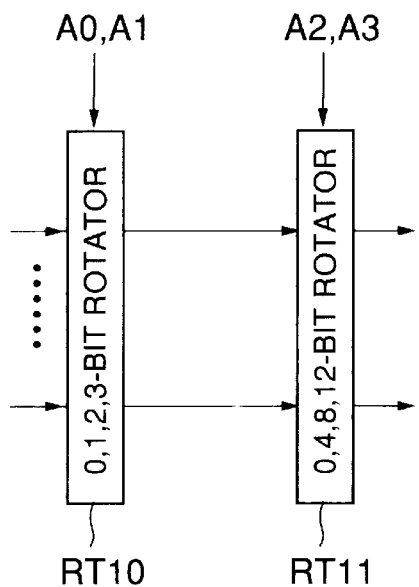
FIG. 6 is a circuit diagram showing another arrangement of the word line rotator in the semiconductor storage device according to the first embodiment.

The word line rotator WLR may have an arrangement like the one shown in FIG. 6 as well. Like the circuit arrangement shown in FIG. 3, this word line rotator WLR performs rotation by using n (n=4 in this case) base addresses A0 to An−1 (=A3). However, this circuit arrangement uses 0/1/2/3-bit rotator RT10 and 0/4/8/12-bit rotator RT11, each formed by a 4-1 multiplexer, unlike the arrangement in FIG. 3.

The 0/1/2/3-bit rotator RT10 performs rotation while its rotate amount is controlled to one of 0 to 3 bits on the basis of the two base addresses A0 and A1. The rotate amount of the 0/4/8/12-bit rotator RT11 is controlled on the basis of the two base addresses A2 and A3. This rotator performs one of 0-, 4-, 8-, and 12-bit rotations with respect to a signal having passed through the 0/1/2/3-bit rotator RT10, and outputs the resultant signal. If, for example, the base addresses are (A3, A2), (A1, A0)=(1, 0), (0, 1), rotation corresponding to 2·3+1=9 bits is performed.

Figure 7:
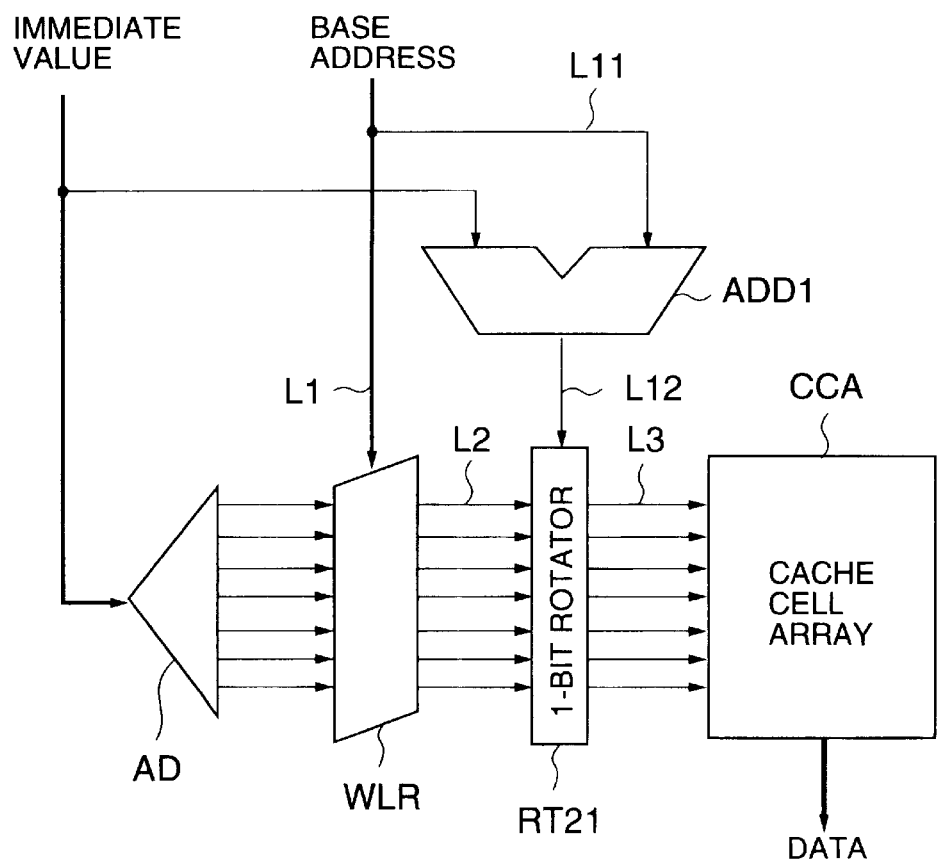
FIG. 7 is a circuit diagram showing the arrangement of a semiconductor storage device according to the second embodiment of the present invention.

A semiconductor storage device according to the second embodiment of the present invention will be described with reference to FIG. 7 showing its arrangement. Some type of cache memory does not use predetermined lower bits of an address in selecting a word line. In the device shown in FIG. 8, an immediate value and base address are added by using an adder ADD in an address calculation, and a word line can be selected without any trouble by using only upper bits of the obtained sum. This is because, even if a carry is produced from a lower bit upon addition of the immediate value and base address, the carry is added to an upper bit.

In the first embodiment shown in FIG. 1, rotation cannot be performed with this carry being reflected in an upper bit. To cope with a case wherein a carry is produced upon addition of the lower bits of an immediate value and base address which are not used for word line selection, the second embodiment includes an adder ADD1 for adding lower addresses and a 1-bit rotator RT21 whose rotate amount is controlled by a carry signal based on the addition result.

Only the upper bits of the immediate value which are used for word line selection are input to an address decoder AD, and the lower bits are input to the adder ADD1. Only the upper bits of the base address which are used for word line selection are input to a word line rotator WLR, and the lower bits are input to the adder ADD1.

The address decoder AD decodes the upper bits of the immediate value which are used for word line selection, and selects one of word lines WL. The rotate amount of the word line rotator WLR is controlled in accordance with the upper bits of the base address which are used for word line selection, and the output from the address decoder AD is rotated by this rotate amount.

The adder ADD1 receives the lower bits of the immediate value and base address and adds them to generate and output a carry signal representing the presence/absence of a carry.

The 1-bit rotator RT21 rotates the output from the word line rotator WLR by one bit in accordance with the carry signal or passes the output without rotation. The output from the 1-bit rotator RT21 is supplied to a cache cell array CCA to select one of the word lines WL.

Assume that the word line WL is selected by using a 6-bit address (A[5:0]), and 1-byte data is read out from the cache memory that outputs 32-bit data (D[31:0]). Of the address (A[5:0]) the lower two bits are not used, and an upper 4-bit address A (A[5:2]) is used to select the word line WL. Of 4-byte data D ([31:0]) read out from the selected memory cell, a lower 2-bit address (A[1:0]) is used to select one byte.

As described above, according to this embodiment, the word line WL is selected by using the upper 4-bit immediate value ([5:2]), Rotation of the word line WL is performed by using the upper 4-bit base address ([5:2]). In addition, if a carry occurs upon addition of the lower two bits of the immediate value and base address ([1:0]), 1-bit rotation is performed. If no carry occurs, the output from the word line rotator WLR is passed through and supplied to the cache cell array CCA.

Assume that the immediate value and base address are "000011" and "000001", respectively, and the lower two bits of each value are not used to select the word line WL. In this case, if the lower bits of the respective values are added, "100" is obtained, resulting in a 1-bit carry. The occurrence of such a carry is detected by the adder ADD1, 1-bit rotation is performed by the 1-bit rotator RT21.

According to this embodiment, the present invention can be applied to a case wherein the word line WL is selected by using all the bits of an address as well as a case wherein the word line WL is selected without using the lower bits of the address.

In the circuit arrangement shown in FIG. 7, a critical path for determining an overall access speed is a line for performing arithmetic processing by using an upper 4-bit base address B ([5:2]) or lower 2-bit base address B ([1:0]).

More specifically, a critical path is one of the following lines: a line L1 through which the base address ([5:2]) is input to the word line rotator WLR, a line L2 through which an output from the word line rotator WLR is supplied to the 1-bit rotator RT21, a line L3 through which an output from the 1-bit rotator RT21 is supplied to the cache cell array CCA, a line L11 through which the base address B ([1:0]) is supplied to the adder ADD1, a line L12 through which an output from the adder ADD1 is supplied to the 1-bit rotator RT21, and a line passing through the line L3 through which the output from the 1-bit rotator RT21 is supplied to the cache cell array CCA.

Since this critical path exhibits a delay time shorter than that in the critical path shown in FIG. 10 through which a base address passes through the adder ADD and address decoder AD, the overall access speed can be increased. This device is associated with processing in the address decoder AD using only an immediate value whose value is determined earlier than a base address The overall access speed can therefore be increased as compared with the conventional device that needs to add a base address and immediate value.

Figure 8:
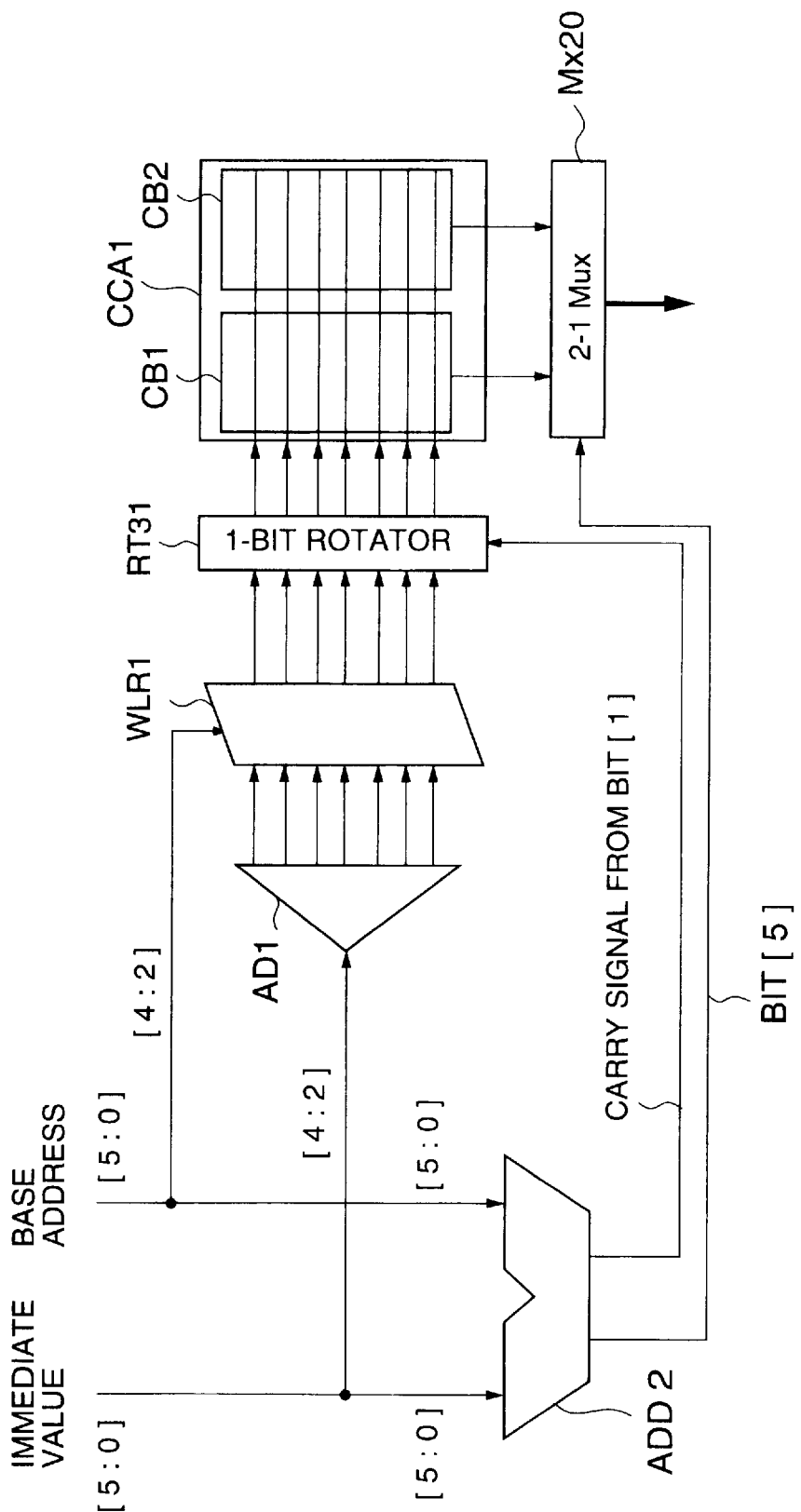
FIG. 8 is a circuit diagram showing the arrangement of a semiconductor storage device according to the third embodiment of the present invention.

The third embodiment of the present invention will be described with reference to FIG. 8 showing its arrangement.

A semiconductor storage device according to this embodiment includes an address decoder AD1, word line rotator WLR1, 1-bit rotator RT31, cache cell array CCA1, and 2-1 multiplexer M×20.

This embodiment is configured to access the cache cell array CCA1 by using some bits of an address required to access a memory cell, and more specifically, bits [4:2] excluding the upper one bit [5] and lower two bits [1:0], instead of inputting all the bits of the address to the address decoder AD1.

The cache cell array CCA1 is divided into two cell blocks CB1 and CB2, each of which is connected to common word lines, eight word lines in this case. The 2-1 multiplexer M×20 selects one of two data concurrently read out from the respective cell blocks CB1 and CB2 by using the upper one bit [5].

As described above, the number of bits input to the address decoder AD1 is decreased by using some bits of an address for the selection of output data. As a consequence, the number of word lines connected to the output of the address decoder AD1 is also decreased. More specifically, if [5:2] of the address bits [5:0] is used, 16 (=$2^4$) word limes are required. In this embodiment, by using [4:2], the number of word lines is 8(=$2^3$), which is half the number of word lines. With this arrangement, the circuit area of the address decoder AD1 can be reduced. In addition, by decreasing the number of word lines, the time required to select a word line can be shortened, and the operation speed can be increased.

First of all, the address decoder AD1 receives bits [4:2] of all the bits [5:0] of an immediate value contained in an instruction code, and outputs the decoding result to the word line rotator WLR1. This decoding result is supplied in the form in which, for example, one of eight word lines is at high level, and all the remaining lines are at low level.

Of all the bits [5:0] of a base address contained in the instruction code, bits [4:2] are supplied to the word line rotator WLR1. The word line rotator WLR1 then rotates the decoding result in accordance with the rotate amount defined by the bits [4:2] For example, of the eight word lines, rotation is performed with respect to one word line to which a high-level signal is output.

Only the three bits [4:2] are input to the word line rotator WLR1 instead of all the bits of the base address. When the word line rotator WLR1 is to be constituted by 2-1 multiplexers, 24 (=8 (the number of word lines)×3 (the number of control signals for the word line rotator WLR) multiplexers are required.

When four bits [5:2] of the base address are to be input to the word line rotator WLR1, since the number of word lines is 16 and the number of control signals for the word line rotator WLR1 is four, 64 (=16×4) multiplexers are required. According to this embodiment, the circuit areas of the address decoder AD1 and word line rotator WLR1 can be reduced, and their operation speeds can be increased.

After the decoding result is rotated by the word line rotator WLR1, the result is rotated by the 1-bit rotator RT31.

This operation is performed to cope with a case wherein a carry occurs when lower two bits [1:0] of an immediate value and lower two bits [1:0] of a base address, which are not used by the address decoder AD1 and word line rotator WLR1, are added, as in the second embodiment. The immediate value and base address are input to the adder ADD2 to be added. It a carry occurs upon addition of the lower two bits [1:0] of each value, a carry signal is generated and output to the 1-bit rotator RT31.

In this case, all the bits of the immediate value and base address are input to detect a carry at bit [1]. However, only the lower two bits [1:0] of each value may be input to detect a carry, and a carry signal may be output.

If a carry occurs and a carry signal is supplied to the 1-bit rotator RT31, an output from the word line rotator wLR1 is rotated by one bit. If no carry occurs, no rotation is performed.

One word line commonly connected to the two cell blocks CB1 and CB2 is selected in accordance with an output from the 1-bit rotator RT31, and two data area read out.

In this embodiment, since the number of word lines decreases to ½, data are simultaneously read out from the two cell blocks CB1 and CB2 each having ½ capacity, and one of the data is selected by using the sum of bits [5] that are not used for word line selection.

More specifically, all he bits of the immediate value [5:0] and base address [5:0] are input to the adder ADD2 to be added. Of the addition result, the bit [5] data is supplied to the 2-1 multiplexer M×20 to select one of the two data. The selected data is then output.

In this embodiment, access to a word line is made by using 3 bits [4:2] of an immediate value and base address without using the lower bits [1:0]. This is because three bits suffice to select eight word lines.

If, for example, data output from each of the cell blocks CB1 and CB2 consists of 32 bits, 32-bit data is read out altogether.

Assume that a word line is to be selected by using four bits [4:1] of each of immediate value and base address, including a lower bit [1]. In this case, memory cells of 32 bits connected to one word line are selected for each pair of cell blocks CB1 and CB2. A half of the selected memory cells are then selected to select and read out 16-bit data. Assume that a word line is to be selected by using five bits [4:0] of each of immediate value and base address, including a lower bit [1:1]. In this case, memory cells of 32 bits connected to one word line are selected for each pair of cell blocks CB1 and CB2. A quarter of the selected memory cells are then selected to select and read out 8-bit data.

In this embodiment, of the bits [5:0] of an immediate value and base address, the address bits [5] are not input to the decoder AD1 and word line rotator WLR1, thus reducing the number of word lines to ½.

However, the present invention is not limited to this. For example, the address bits [5:4] may not be input to the decoder and word line rotator to reduce the number of word lines to ¼.

Figure 9:
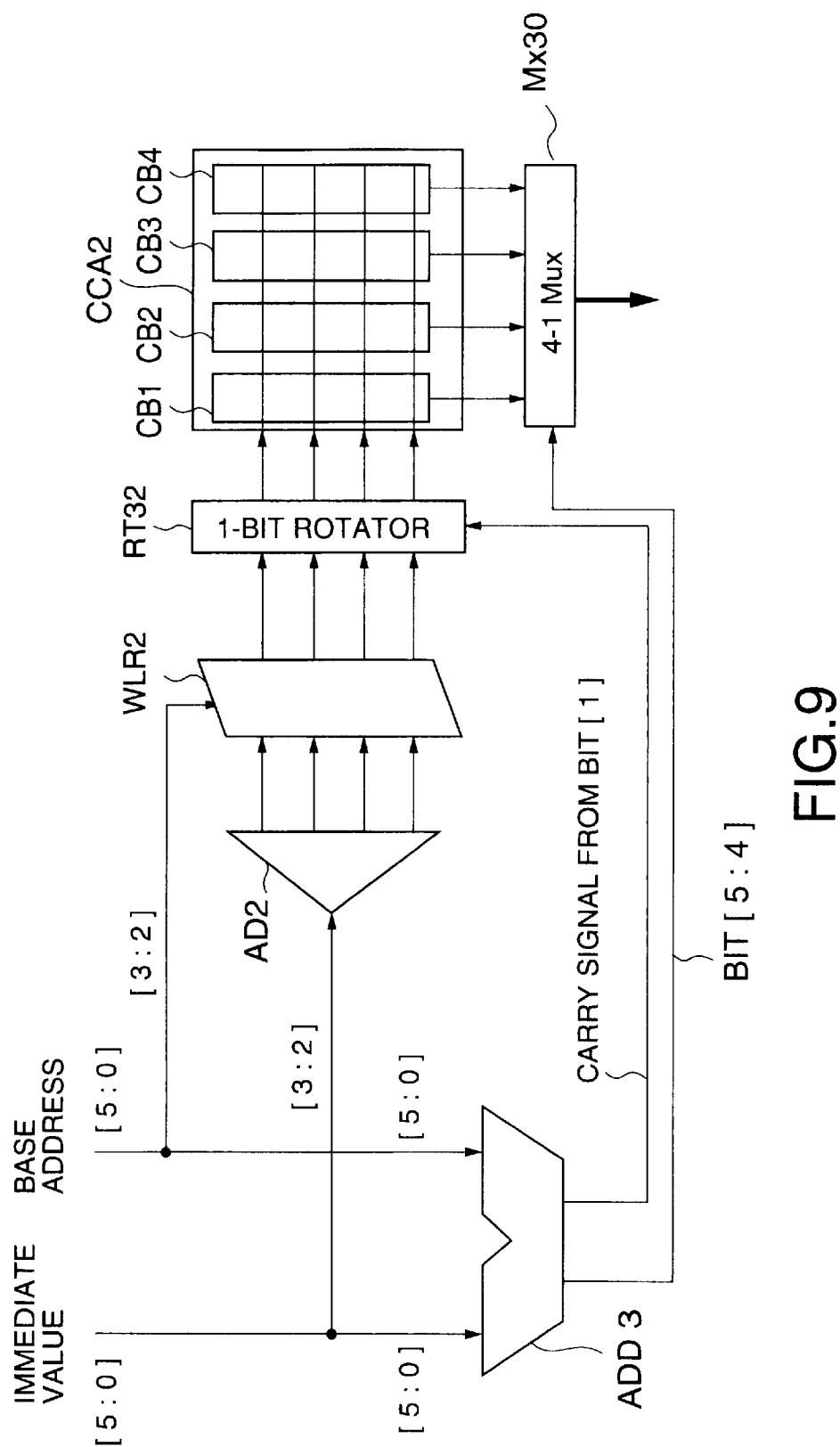
FIG. 9 is a circuit diagram showing the arrangement of a semiconductor storage device according to the fourth embodiment of the present invention.

The fourth embodiment of the present invention will be described with reference to FIG. 9.

A semiconductor storage device according to this embodiment includes an address decoder AD2, word line rotator WLR2, 1-bit rotator RT32, cache cell array CCA2, adder ADD3, and 4-1 multiplexer M×30.

This embodiment is configured to access the cache cell array CCA2 by using some bits of an address required to access a memory cell, and more specifically, bits [3:2] excluding the upper two bits [5:4] and lower two bits [1:0], instead of inputting all the bits of the address to the address decoder AD2.

The cache cell array CCA2 is divided into four cell blocks CB1 to CB4. Each cell block is connected to common word lines, four word lines in this case. The 4-1 multiplexer M×30 selects one of four data concurrently read out from the cell blocks CB1 to CB4 by using the upper two bits [5:4].

As described above, the number of bits input to the address decoder AD2 is decreased by using some bits of an address for the selection of output data. As a consequence, the number of word lines connected to the output of the address decoder AD2 decreases to eight, which is ¼ the number of word lines, i.e., 16, when bits [5:2] are used. This makes it possible to reduce the circuit area of the address decoder AD2 and increase the operation speed.

First of all, bits [3:2] of all the bits [5:0] of an immediate value contained in an instruction code are input to the address decoder AD2. The decoding result is output to the word line rotator WLR2. This decoding result is supplied in the form that, for example, one of four word lines is at high level, and all the remaining word lines are at low level.

The bits [3:2] of all the bits [5:0] of a base address contained in the instruction code are supplied to the word line rotator WLR2. The decoding result is rotated in accordance with the rotate amount defined by the bits [3:2]. In this case, of the four word lines, rotation is performed with respect to one word line to which a high-level signal is output.

Only the two bits [3:2] are input to the word line rotator WLR2 instead of all the bits of the base address. When the word line rotator WLR2 is to be constituted by 2-1 multiplexers, 8 (=4 (the number of word lines)×2 (the number of control signals for word line rotator WLR) multiplexers are required.

When four bits [5:2] of the base address are to be input to the word line rotator WLR, 64 (=16×4) multiplexers are required, as described above. According to this embodiment, therefore, the circuit areas of both the address decoder AD2 and the word line rotator WLR2 can be reduced, and the operation speeds can be increased.

After the decoding result is rotated by the word line rotator WLR2, the result is rotated by the 1-bit rotator RT32. This makes it possible to cope with a case wherein a carry occurs when the lower two bits [1:0] of an immediate value and the lower two bits [1:0] of a base address, which are not used for the address decoder AD2 and word line rotator WLR2, are added. More specifically, when the immediate value and base address are input to the adder ADD3 to be added, and a carry occurs upon addition of the lower two bits [1:0] of each value, a carry signal is generated and output to the 1-bit rotator RT32.

In this case, all the bits of each of the immediate value and base address are input to detect a carry at the bit [1]. However, as described in the third embodiment, the lower two bits [1:0] of each value may be input to detect a carry and output a carry signal.

If a carry occurs and a carry signal is supplied to the 1-bit rotator RT32, an output from the word line rotator WLR2 is rotated by one bit. If no carry occurs, no rotation is performed.

One of the word lines commonly connected to the four cell blocks CB1 to CB4 is selected in accordance with an output from the 1-bit rotator RT32, and four data are concurrently read out.

According to this embodiment, since the number of word lines is reduced to ¼, data are concurrently read out from the four cell blocks CB1 to CB4, each having ¼ capacity, and one of the data is selected by using the sum of bits [5:4] that are not used for word line selection.

More specifically, the immediate value [5:0] and base address [5:0], each including all bits, are input to the adder ADD3 to be added. Of the addition result, the bit [5:4] data is supplied to the 4-1 multiplexer M×30. As a consequence, one of the four data is selected and output.

The above embodiments are examples and do not limit the present invention. For example, the circuit arrangement of the address decoder is not limited to the one shown in FIG. 2, and any circuit arrangement can be used as long as it is designed to perform decoding processing of selecting a word line WL by using a predetermined number of bits of an immediate value. In addition, the arrangement of the word line rotator is not limited to the one shown in FIG. 3, 4, or 5. Various modifications of this arrangement can be made.

In the second embodiment described above, access to a word line is made without using the lower two bits of each of an immediate value and base address. However, the present invention can be applied to a case wherein lower one to three bits are not used as well as a case wherein lower two bits are not used.

In the arrangement shown in FIG. 7, the 1-bit rotator RT21 is placed between the output side of the word line rotator WLR and the cache cell array CCA. This is because the timing at which the value of a carry signal is determined is later than the timings at which the values of an immediate value and base address are determined, and the access speed can be effectively increased by placing the rotator on a rear stage closer to the cache cell array CCA. If, however, the difference between the timing at which the adder ADD1 outputs a carry signal and the timing at which the word line rotator WLR outputs a signal is small, or a carry signal is output earlier, the 1-bit rotator RT21 may be placed between the address decoder AD and the word line rotator WLR.

What is claimed is:

1. A semiconductor storage device in which access is made by generating an address by using first and second signals, comprising:

an address decoder for generating a decode signal by performing decoding using the first signal whose value is determined at a timing equal to or earlier than a timing at which a value of the second signal is determined;

a word line rotator for rotating the decode signal generated by said address decoder by using the second signal to generate a word line selection signal; and a cell array to which the word line selection signal generated by said word line rotator is supplied to select a word line.

2. A device according to claim 1, wherein said word line rotator includes a multiplexer group having series-connected multiplexers equal in number of bit signals for the second signal.

3. A device according to claim 2, wherein a signal, of the second signals supplied to the word line rotator, whose value is determined at a latest timing is supplied to the last multiplexer of said multiplexer group.

4. A semiconductor storage device in which access is made by generating an address by using first and second signals, comprising:

an address decoder for generating a decode signal by performing decoding using a predetermined pit of the first signal whose value is determined at a timing equal to or earlier than a timing at which a value of the second signal is determined;

a word line rotator for rotating the decode signal generated by said address decoder by using a predetermined bit of the second signal to generate a word line selection signal;

an adder for generating a carry signal representing the presence/absence of a carry by performing addition processing using bits of the first signal excluding the predetermined bit and bits of the second signal excluding the predetermined bit;

a carry rotator for generating a second word line selection signal by rotating the first word line selection signal, generated by said word line rotator, in accordance with the carry signal generated by said adder, as needed; and a cell array to which the second word line selection signal generated by said carry rotator is supplied to select a word line.

5. A device according to claim 4, wherein said word line rotator includes a multiplexer group having series-connected multiplexers equal in number of bit signals for the second signal.

6. A device according to claim 5, wherein a signal, of the second signals supplied to the word line rotator, whose value is determined at a latest timing is supplied to the last multiplexer of said multiplexer group.

7. A device according to claim 4, wherein said carry rotator is placed between said word line rotator and said memory cell array.

8. A device according to claim 5, wherein said carry rotator is placed between said word line rotator and said memory cell array.

9. A semiconductor storage device in which access is made by generating an address by using first and second signals, comprising:

an address decoder for generating a decode signal by performing decoding using data of Q bits of data of N (N is an integer not less than two) bits of the first signal whose value is determined at a timing equal to or earlier than a timing at which a value of the second signal is determined, excluding data of upper M (M is an integer smaller than N) bits, and data of lower P (P is an integer smaller than N) bits contained in the data of the N bits;

a word line rotator for rotating the decode signal generated by said address decoder by using data of Q bits contained in data of N bits of the second signal to generate a first word line selection signal;

an adder for generating a carry signal representing the presence/absence of a carry at a position of the Pth bit by performing addition processing using the data of the N bits of the first signal and the data of the N bits of the second signal, and also outputting an addition result at a position of the Nth bit;

a carry rotator for generating a second word line selection signal by rotating the first word line selection signal, generated by said word line rotator, in accordance with the carry signal generated by said adder, as needed; and a cell array to which the second word line selection signal generated by said carry rotator is supplied to select a word line and output R (R is an integer not less than two) data; and a multiplexer to which the addition result at the position of the Mth bit is supplied to select and output one of the R data.

10. A device according to claim 9, wherein said word line rotator includes a multiplexer group having series-connected multiplexers equal in number of bit signals for the second signal.

11. A device according to claim 10, wherein a signal, of the second signals supplied to the word line rotator, whose value is determined at a latest timing is supplied to the last multiplexer of said multiplexer group.

12. A device according to claim 9, wherein said carry rotator is placed between said word line rotator and said memory cell array.

* * * * *